US012696414B2

(12) United States Patent
Huang

(10) Patent No.: US 12,696,414 B2
(45) Date of Patent: Jul. 28, 2026

(54) TRAY AND ELECTRONIC DEVICE

(71) Applicant: Wistron Corporation, New Taipei City (TW)

(72) Inventor: Kun Huang, New Taipei City (TW)

(73) Assignee: WISTRON CORPORATION, New Taipei City (TW)

( * ) Notice: Subject to any disclaimer, the term of this patent is extended or adjusted under 35 U.S.C. 154(b) by 294 days.

(21) Appl. No.: 18/496,087

(22) Filed: Oct. 27, 2023

(65) Prior Publication Data

US 2025/0063681 A1 Feb. 20, 2025

(30) Foreign Application Priority Data

Aug. 17, 2023 (TW) ................................. 112131036

(51) Int. Cl.
*H05K 7/14* (2006.01)

(52) U.S. Cl.
CPC ......... *H05K 7/1487* (2013.01); *H05K 7/1401* (2013.01)

(58) Field of Classification Search
CPC ........................... H05K 7/1487; H05K 7/1401
See application file for complete search history.

(56) References Cited

U.S. PATENT DOCUMENTS

2021/0068296 A1* 3/2021 Liao ................. H01R 13/62983

FOREIGN PATENT DOCUMENTS

| TW | 200507729 A | | 2/2005 |
|---|---|---|---|
| TW | M630680 U | * | 8/2022 |
| TW | 202306468 A | | 2/2023 |

OTHER PUBLICATIONS

Examination report dated Apr. 25, 2024, listed in related Taiwan patent application No. 112131036.

* cited by examiner

*Primary Examiner* — Jerry Wu

(74) *Attorney, Agent, or Firm* — McClure, Qualey & Rodack, LLP

(57) ABSTRACT

A tray is for an electronic device. The tray includes a bottom plate, a mounting plate, a handle, and an elastic component. The mounting plate is fixed on the bottom plate, and includes a first locking hole and a second locking hole. The handle is disposed pivotally on the bottom plate. The handle is disposed between the mounting plate and the bottom plate. The handle includes a through groove and a holding portion. The holding portion is disposed at one end of the handle and is exposed out of the bottom plate. In addition, the elastic component is fixed on the handle and includes a first protrusion portion. The first protrusion portion in the through groove protrudes toward the mounting plate, and is selectively disposed in the first locking hole or the second locking hole.

16 Claims, 14 Drawing Sheets

33

L3

30

12

51

42

13

D2

12

11

36

74

70

72

35

23

41

40

Z

Y    X

50

50

55    53    57

51

TRAY AND ELECTRONIC DEVICE

CROSS-REFERENCE TO RELATED APPLICATION

This non-provisional application claims priority under 35 U.S.C. § 119(a) to patent application No. 112131036 filed in Taiwan, R.O.C. on Aug. 17, 2023, the entire contents of which are hereby incorporated by reference.

BACKGROUND

Technical Field

The present invention relates to a tray and an electronic device having the same.

Related Art

In a communication and information center, a large server is usually in the form of a cabinet. To expand hardware equipment of the server, a chassis may be mounted in a cabinet according to user needs, where a connector of the chassis is docked with a connector of the cabinet. However, during the process of assembling the chassis with the cabinet, an external force of 150 N is applied for connecting the connector of the chassis to the connector of the cabinet. On the contrary, during the process of disassembling the chassis from the cabinet, a counter-acting force of 150 N will be generated. Therefore, for the chassis disposed with an assistant handle, when the chassis is disengaged from the cabinet, the assistant handle will be instantly ejected out from the cabinet by virtue of the counter-acting force generated, which results in injury of an operator. Furthermore, there is a gap between the assistant handle and the chassis for accommodating components. As a result, the assistant handle is easy to swing in the operating process, and the operator, on the contrary, needs to apply more power to stabilize the movement of the handle.

SUMMARY

In view of the above problems, embodiments of the present invention provide a tray and an electronic device having the same.

According to any one or some embodiments, a tray is provided, and the tray includes a bottom plate, a mounting plate, a handle, and an elastic component. The mounting plate is disposed on the bottom plate and includes a first locking hole and a second locking hole. The handle is disposed pivotally on the bottom plate and is disposed between the mounting plate and the bottom plate. In addition, the elastic component is disposed on the handle and includes a first protrusion portion. The first protrusion portion protrudes toward the mounting plate. The first protrusion portion is selectively disposed in the first locking hole or the second locking hole.

According to any one or some embodiments, an electronic device is provided, and the electronic device includes a cabinet and a chassis. The chassis is accommodated in the cabinet and includes a bottom plate, a mounting plate, a handle, and an elastic component. The mounting plate is disposed on the bottom plate and includes a first locking hole and a second locking hole. The handle is pivotally disposed on the bottom plate. The handle is disposed between the mounting plate and the bottom plate. In addition, the elastic component is disposed on the handle and includes a first protrusion portion. The first protrusion portion protrudes toward the mounting plate. The first protrusion portion is selectively disposed in the first locking hole or the second locking hole.

In conclusion, according to any one or some embodiments, the elastic component disposed on the handle is selectively locked in the first locking hole or the second locking hole of the mounting plate. The elastic component may decelerate the ejection speed of the handle to prevent occurrence of danger due to a rapid ejection of the handle. In addition, according to one or some embodiments, it is convenient to the operator for using the handle during operation. Accordingly, the electronic device with the convenience of assembling can be provided.

Detailed features and advantages of the present invention are described in detail in the following implementations, and the content of the implementations is sufficient for a person skilled in the art to understand and implement the technical content of the present invention. A person skilled in the art can easily understand the objectives and advantages related to the embodiments of the present invention according to the contents disclosed in this specification, the claims, and the drawings.

BRIEF DESCRIPTION OF THE DRAWINGS

The instant disclosure will become more fully understood from the detailed description given herein below for illustration only, and thus not limitative of the instant disclosure, wherein.

DETAILED DESCRIPTION

Figure 1:
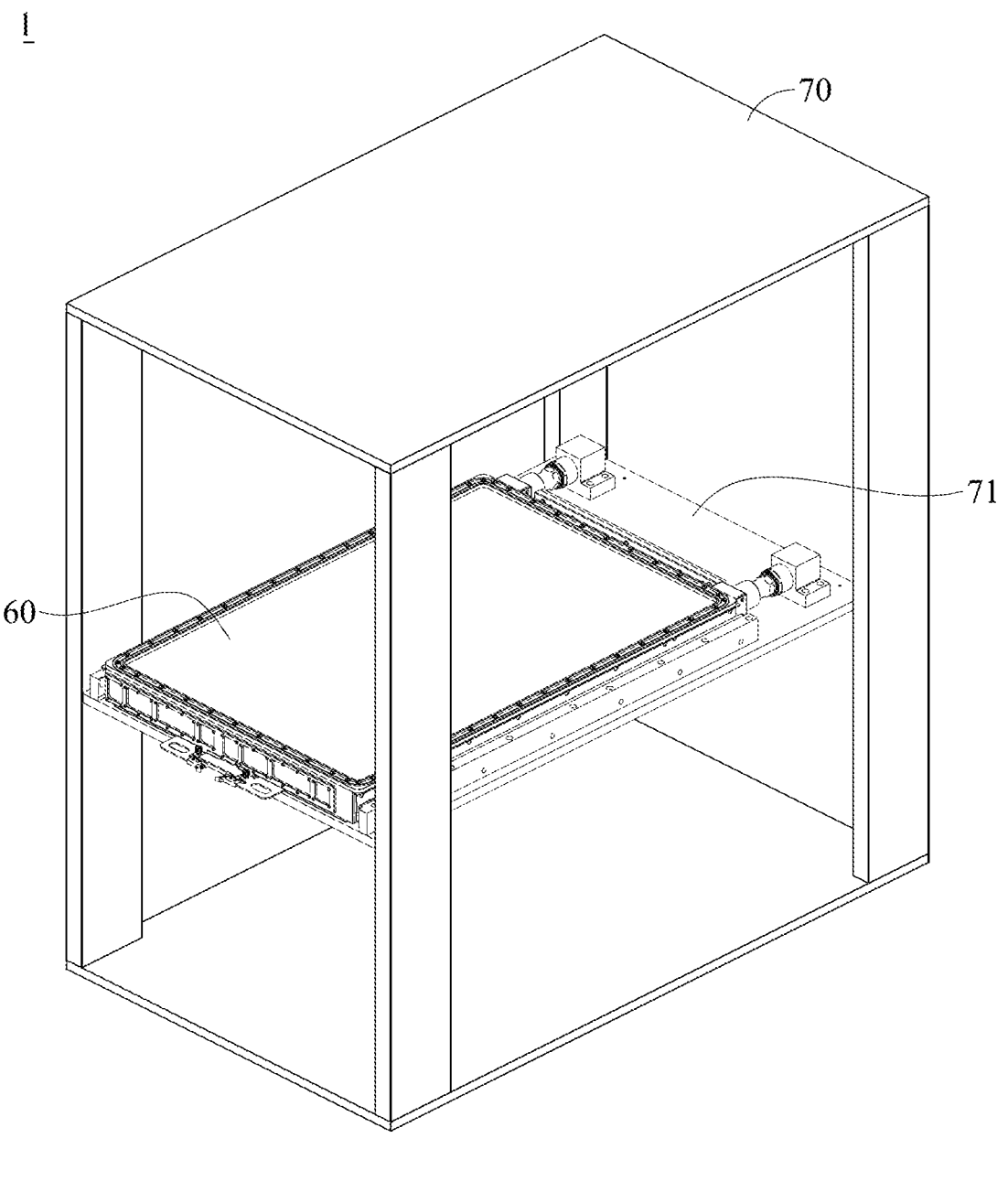
FIG. 1 illustrates a perspective view of an electronic device according to some embodiments.
Figure 2:
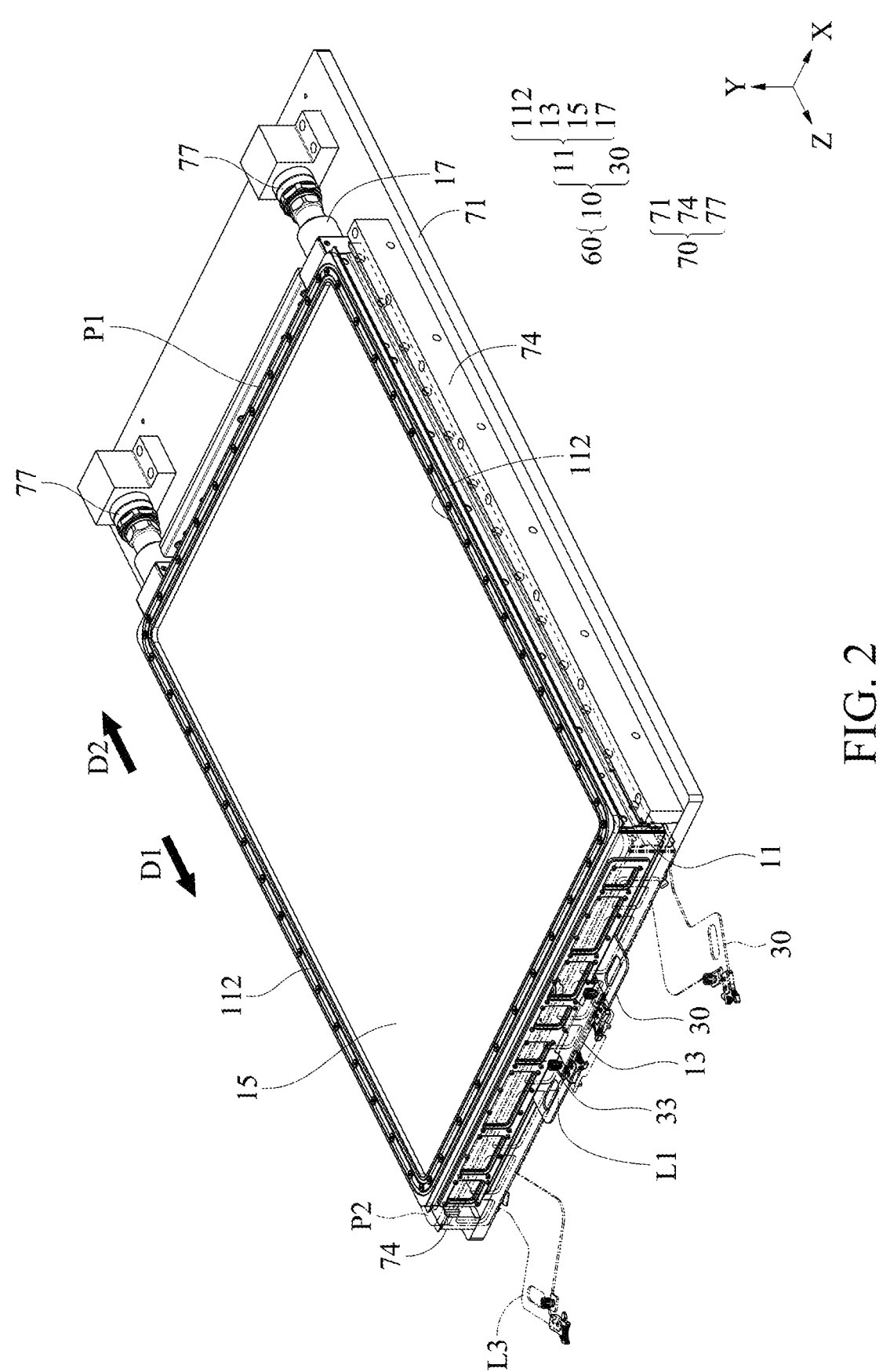
FIG. 2 illustrates a partial perspective view of a frame according to some embodiments, showing that a chassis is disposed on the frame, wherein a tray at a released position and a handle at an unlocked position are denoted by one-point chain-dotted lines; the tray at an engaged position and the handle at a locked position are denoted by solid lines; and arrows in two directions respectively represent a withdrawn direction and an insertion direction of the tray.
Figure 3:
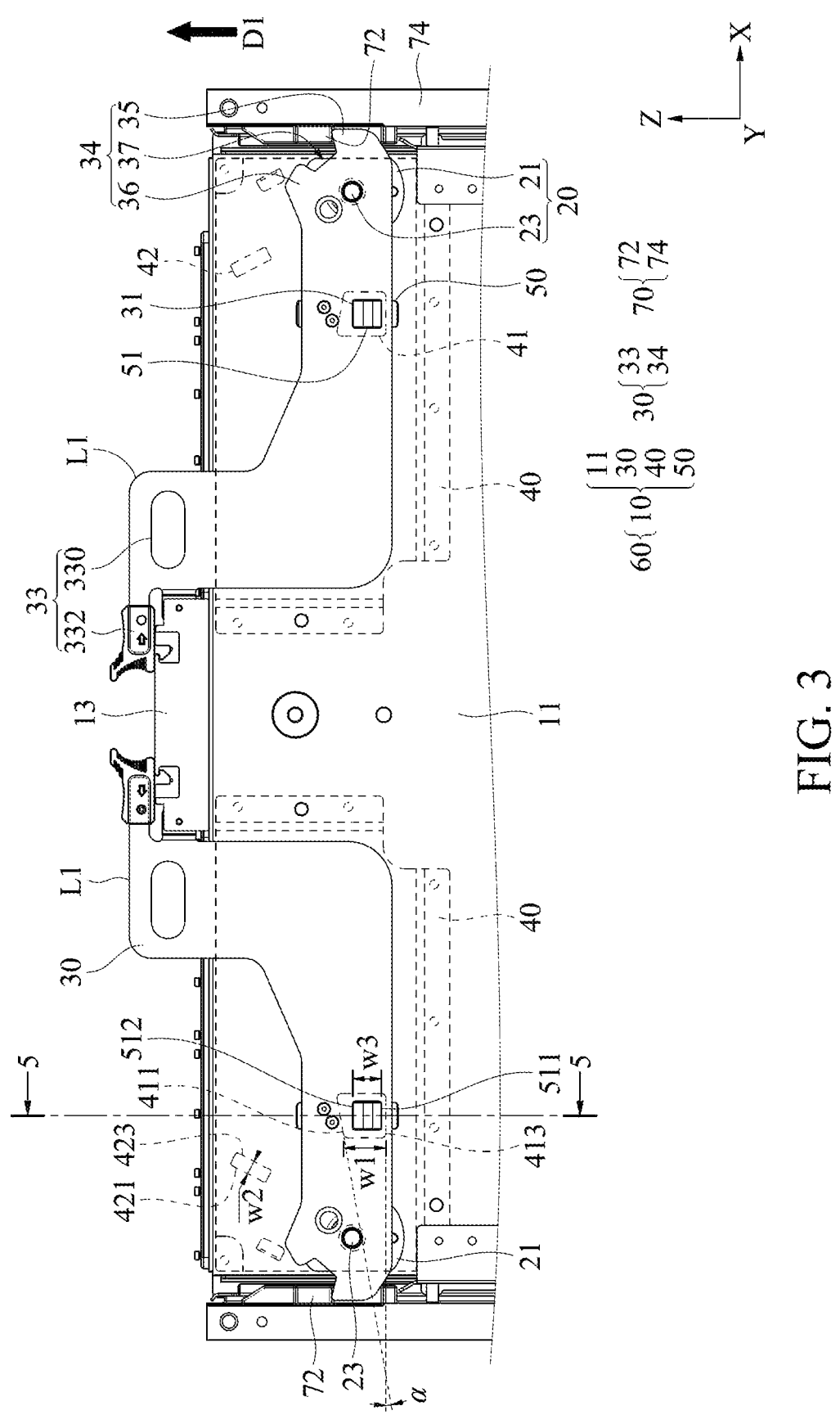
FIG. 3 illustrates a partial perspective view of a frame according to some embodiments, showing that a handle is disposed at the locked position, wherein a mounting plate is denoted by dotted lines; and an arrow represents a withdrawn direction of the tray.
Figure 4:
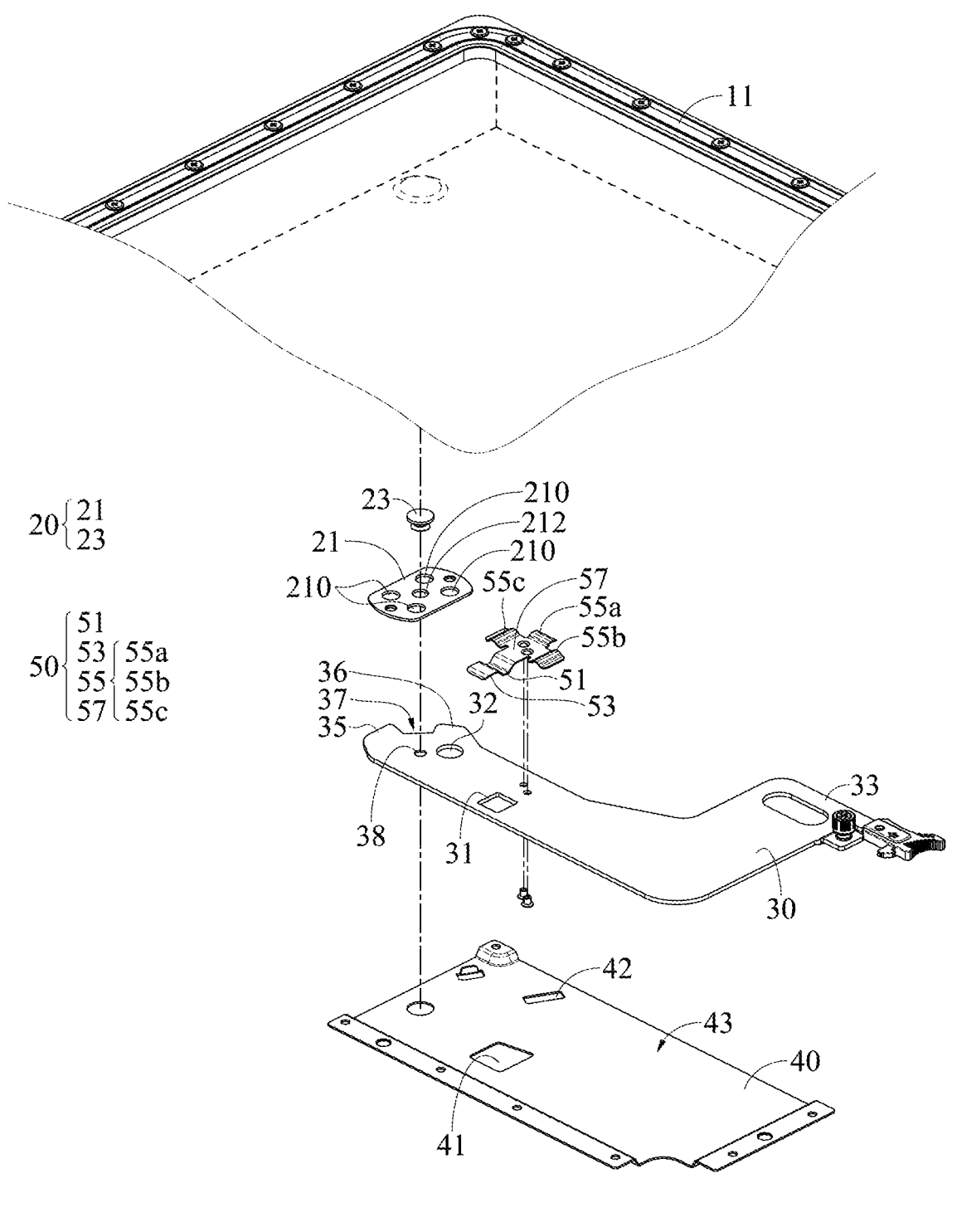
FIG. 4 illustrates a partial exploded view of a tray according to some embodiments, showing a bottom plate, a handle, an elastic component, a pivoting member, and a mounting plate.

Please refer to FIG. 1, FIG. 2, FIG. 3, and FIG. 4. FIG. 1 illustrates a perspective view of an appearance of an electronic device 1 according to some embodiments; FIG. 2 illustrates a partial perspective view of a frame 71 according to some embodiments, showing that a chassis 60 is disposed on the frame 71, wherein a tray 10 at a released position P2 and a handle 30 at a unlocked position L3 are denoted by one-point chain-dotted lines; the tray 10 at an engaged position P1 and the handle 30 at a locked position L1 are denoted by solid lines; and arrows in two directions respectively represent a withdrawn direction D1 and an insertion direction D2 of the tray 10; FIG. 3 illustrates a partial perspective view of a frame 71 according to some embodiments, showing that a handle 30 is disposed at the locked position L1, wherein a mounting plate 40 is denoted by dotted lines; and an arrow represents a withdrawn direction D1 of the tray 10; and FIG. 4 illustrates a partial exploded view of a tray 10 according to some embodiments, showing a bottom plate 11, a handle 30, an elastic component 50, a pivoting member 20, and a mounting plate 40. FIG. 1 shows that one chassis 60 is mounted in the cabinet 70, but the present invention is not limited thereto. In some embodiments, a plurality of chassis 60 may be mounted in the cabinet 70. Unless otherwise specified as electrical connection, terms "connection" or "connect" in the following embodiments may be physical connection between physical components or may be direct or indirect connection between physical components.

Please refer to FIG. 1, FIG. 2, and FIG. 3. The electronic device 1 includes the cabinet 70 and the chassis 60. The chassis 60 is accommodated in the cabinet 70. In FIG. 2, the chassis 60 includes the tray 10. In FIG. 3, the tray 10 includes the bottom plate 11, the handle 30, the mounting plate 40, and the elastic component 50, where the mounting plate 40 is disposed on the bottom plate 11. The mounting plate 40 includes a first locking hole 41 and a second locking hole 42. The handle 30 is pivotally disposed on the bottom plate 11, and the handle 30 is disposed between the mounting plate 40 and the bottom plate 11. In addition, in FIG. 4, the elastic component 50 is disposed on the handle 30, and the elastic component 50 includes a first protrusion portion 51. The first protrusion portion 51 protrudes toward the mounting plate 40, and the first protrusion portion 51 is selectively disposed in the first locking hole 41 or the second locking hole 42. In some embodiments, the electronic device 1 may be, but not limited to, a frame server, a liquid-cooled server, a water-cooled server, a non-liquid-cooled server (for example, an air-cooled server), or the like. In some embodiments, the chassis 60 includes an expansion module (not shown in the figures). The tray 10 is used to be installed to the expansion module. The expansion module may be, but not limited to, a computer hard disc, a display card, or an expansion card. In some embodiments, the elastic component 50 may be, but not limited to, a flat spring, an elastic sheet in a shape as shown in FIG. 4, or the like.

When an operator would like to detach the chassis 60 from the cabinet 70, the operator may apply a force to a holding portion 33 of the handle 30 to rotate the handle 30 toward a direction away from the cabinet 70. The elastic component 50 on the handle 30 is locked in the first locking hole 41 or the second locking hole 42. The elastic component 50 may decelerate the ejection speed of the handle 30 to prevent the operator from being injured due to the rapid ejection of the handle 30.

Please refer to FIG. 3. In some embodiments, the handle 30 includes a through groove 31 and the holding portion 33. The holding portion 33 is disposed at one of two ends of the handle 30 and is exposed out of the bottom plate 11. The first protrusion portion 51 is disposed in the through groove 31 and protrudes toward the mounting plate 40 (as shown in FIG. 4). Please refer to FIG. 10. FIG. 10 illustrates an enlarged view of the region B shown in FIG. 9. In some embodiments, the first protrusion portion 51 is used to contact a surface 43 of the mounting plate 40, where surface 43 faces the handle 30.

Please refer to FIG. 2. In some embodiments, the cabinet 70 includes the frame 71. The frame 71 includes a guiding rail portion 74. The chassis 60 is slidably disposed on the guiding rail portion 74 through the bottom plate 11, so that the chassis is disposed on the frame 71. The bottom plate 11 is slidable between the engaged position P1 and the released position P2 with respect to the frame 71. When the bottom plate 11 is disposed at the engaged position P1, the holding portion 33 of the handle 30 is connected to an engaging portion 13 of the bottom plate 11, the handle 30 is disposed at a locked position L1, and the chassis 60 is stably disposed in the cabinet 70. When the bottom plate 11 is disposed at the released position P2, the holding portion 33 of the handle 30 is detached from the engaging portion 13 of the bottom plate 11, the handle 30 is disposed at the unlocked position L3, and a portion of the chassis 60 is exposed out of the cabinet 70. In some embodiments, the guiding rail portion 74 may include a slide rail and pulleys. The slide rail is disposed on the frame 71. The pulleys are uniformly disposed on two side walls 112 of the bottom plate 11. In some embodiments, the bottom plate 11 is slidable through the guiding rail portion 74 with respect to the frame 71 (in other words, in some embodiments, the bottom plate 11 may be slid along the Z axis of FIG. 2). A moving direction of the tray 10 toward an exterior of the frame 71 is a withdrawn direction D1, which is a direction from the engaged position P1 to the released position P2. A moving direction of the tray 10 toward an interior of the frame 71 is an insertion direction D2, which is a direction from the released position P2 to the engaged position P1. Therefore, the tray 10 may be slid stably along the guide rail portion 74, thus the convenience of arraignment can be provided.

Please refer to FIG. 2. In some embodiments, the tray 10 further includes a connector 17. The cabinet 70 (or the frame 71) further includes a docking component 77. The connector 17 is used to be connected to the docking component 77, so that the chassis 60 is disposed in the cabinet 70. In some embodiments, when the bottom plate 11 is disposed at the engaged position P1, the connector 17 is connected to the docking component 77. When the bottom plate 11 is disposed at the released position P2, the connector 17 is detached from the connection of the docking component 77. In some embodiments, the connector 17 may be a blind mate connector, a water-cooled adapter, or a connector used to the liquid-cooled server. The docking component 77 is a corresponding mating connector. In some embodiments, the bottom plate 11 includes a carrying portion 15 and the engaging portion 13. The engaging portion 13 and the connector 17 are respectively disposed at two opposite ends of the carrying portion 15. The carrying portion 15 is used to accommodate the expansion module. In some embodiments, springs are disposed inside the connector 17 and the docking component 77. When the connector 17 is connected to the docking component 77, the springs generate a rebound force due to deformation. The rebound force is used to push the tray 10 toward the direction away from the docking component 77 (namely the withdrawn direction D1).

Please refer to FIG. 3. In some embodiments, the handle 30 may be directly or indirectly pivotally disposed on the bottom plate 11 by virtue of a pivoting member. For example, the pivoting member is riveted to the bottom plate 11, so that the handle 30 is directly pivoted to the bottom plate 11, or the handle 30 is indirectly pivoted to the bottom plate 11 by virtue of the pivoting member 20 (as shown in FIG. 3, the detailed structure thereof is described hereafter). In some embodiments, the number of the handles 30 may be, but not limited, one or more than one. In some embodiments, two handles 30 are described as an example. As shown in FIG. 3, a shaft 23 (the pivoting member) of each of the handles 30 is disposed on one of two sides of the bottom plate 11. Thus, the operator may apply a force to the chassis 60 evenly through the handles 30 and stably install the chassis 60 on the frame 71 or withdraw the chassis 60 from the frame 71 (as shown in FIG. 2).

Please refer to FIG. 3. In some embodiments, the holding portion 33 includes a holding hole 330 and a pressing piece 332. The pressing piece 332 is provided with a hook. The engaging portion 13 is provided with a slot corresponding to the hook of the pressing piece 332. During the disassembling process, the operator holds the handle 30 through the holding hole 330 and presses the pressing piece 332 to relieve the connection between the pressing piece 332 and the engaging portion 13. The tray 10 is pushed toward the direction away from the frame 71 with the rebound force provided by the springs in the connector 17 and the docking component 77 shown in FIG. 2 (in other words, in some embodiments, the movement of the tray 10 is along the withdrawn direction D1). Thus, each of the handles 30 is rotated by taking the corresponding one of the shafts 23 as the rotational axis. As the result, the holding portion 33 is pushed away from the engaging portion 13.

Specifically, please refer to FIG. 3. In some embodiments, the handle 30 includes a locking portion 34. The locking portion 34 and the holding portion 33 are respectively at one of two ends of the handle 30. A distance between one end of the handle 30 and the shaft 23 is greater than that between the other end of the handle 30 and the shaft 23. The distance between the holding portion 33 and the shaft 23 is greater than that between the locking portion 34 and the shaft 23. In some embodiments, the locking portion 34 includes a first hook portion 35 and a second hook portion 36. The first hook portion 35 is connected to the second hook portion 36 to form a recess portion 37. Both ends of the recess portion 37 are respectively connected to the first hook portion 35 and the second hook portion 36. In some embodiments, the handle 30 is used to fit a positioning portion 72 of the cabinet 70 with the locking portion 34 so as to position the chassis 60 in the cabinet 70. In some embodiments, the recess portion 37 corresponds to the positioning portion 72. By taking the embodiment shown in FIG. 3 as an example, the recess portion 37 is in a trapezoidal shape which is wide outside and narrow inside, an opening direction of the recess portion 37 faces the positioning portion 72, the positioning portion 72 is a convex block, and the length of the positioning portion 72 is substantially less than or equal to the opening size of the recess portion 37.

Figure 11:
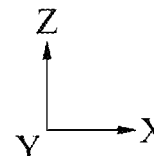
FIG. 11 illustrates a partial perspective view of a frame according to some embodiments, showing that a handle is disposed at the unlocked position, wherein a mounting plate is denoted by dotted lines; and the arrow represents an insertion direction of the tray.

Please refer to FIG. 3 and FIG. 11. FIG. 11 illustrates a partial perspective view of a frame 71 according to some embodiments, showing that a handle 30 is disposed at the unlocked position L3, wherein a mounting plate 40 is denoted by dotted lines; and the arrow represents an insertion direction D2 of the tray 10. In some embodiments, during the rotating process of the handle 30, the positioning portion 72 substantially contacts the first hook portion 35 and the second hook portion 36, respectively. In some embodiments, in FIG. 3, when the bottom plate 11 is disposed at the engaged position P1, the first hook portion 35 substantially contacts the positioning portion 72, and the first hook portion 35 interferes with the positioning portion 72. Please refer to FIG. 2 and FIG. 3. In some embodiments, the recess portion 37 of the locking portion 34 is pushed toward the positioning portion 72 by virtue of the rebound force provided by the connector 17 and the docking component 77. Please refer to FIG. 11. In some embodiments, in FIG. 11, when the bottom plate 11 is disposed at the unlocked position L3, the second hook portion 36 substantially contacts the positioning portion 72.

In addition, please refer to FIG. 3 and FIG. 4. In some embodiments, the tray 10 further includes the pivoting assembly 20. The pivoting assembly 20 is disposed on the bottom plate 11. The handle 30 is pivotally disposed on the bottom plate 11 through the pivoting assembly 20. Please refer to FIG. 4. In some embodiments, the pivoting assembly 20 includes an intermediate component 21 and the shaft 23. The intermediate component 21 is fixed on the bottom plate 11. The shaft 23 passes through the intermediate component 21. The handle 30 is pivotally disposed on the bottom plate 11 through the shaft 23. In some embodiments, the intermediate component 21 is provided with a center hole 212 and a through hole 210. The number of the through hole 210 may be, but not limited, one or more than one. The through hole 210 may be disposed on a periphery of the center hole 212. Please refer to FIG. 4. In some embodiments, the intermediate component 21 is provided with one center hole 212 and four through holes 210. The handle 30 is provided with a mounting hole 32. The mounting hole 32 may be movably aligned with one of the through holes 210. For example, during the assembling process, the shaft 23 may pass through the center hole 212 of the intermediate component 21 and be rivetedly fixed on the intermediate component 21. Then, the shaft 23 may pass through a pivot hole 38 of the handle 30, and the intermediate component 21 is disposed between the shaft 23 and the handle 30. After that, by way of aligning the mounting holes 32 of the handle 30 with the through holes 210 individually, the intermediate component 21 is welded to the bottom plate 11. Thus, the tray 10 may be used to the liquid-cooled server to prevent a liquid leakage problem of the chassis 60 as no hole is formed in the bottom plate 11 for arranging the pivoting member.

Please refer to FIG. 3. In some embodiments, the first locking hole 41 of the mounting plate 40 includes a leaned wall 411 and a bottom wall 413 disposed on two opposite sides of the first locking hole 41. The bottom wall 413 is substantially perpendicular to the guiding rail portion 74. An oblique angle α is between the leaned wall 411 and the bottom wall 413. The width w1 of the first locking hole 41 is the distance between the leaned wall 411 and the bottom wall 413. In some embodiments, the range of the oblique angle α is between 10 degrees and 12 degrees. In some embodiments, a short wall and a long wall are connected between the leaned wall 411 and the bottom wall 413. The length of the short wall is the width w1 of the first locking hole 41. In some embodiments, the shape of the second locking hole 42 of the mounting plate 40 is a rectangle. The second locking hole 42 has two opposite short edges and two opposite long edges 421 and 423. The two long edges 421 and 423 are opposite to each other and disposed in parallel. The distance between the long edges 421 and 423 (or the length of the short edge) is the width w2 of the second locking hole 42. In some embodiments, the opening sizes of the first locking hole 41 and the second locking hole 42 are sufficient to accommodate the first protrusion portion 51.

Figure 13A:
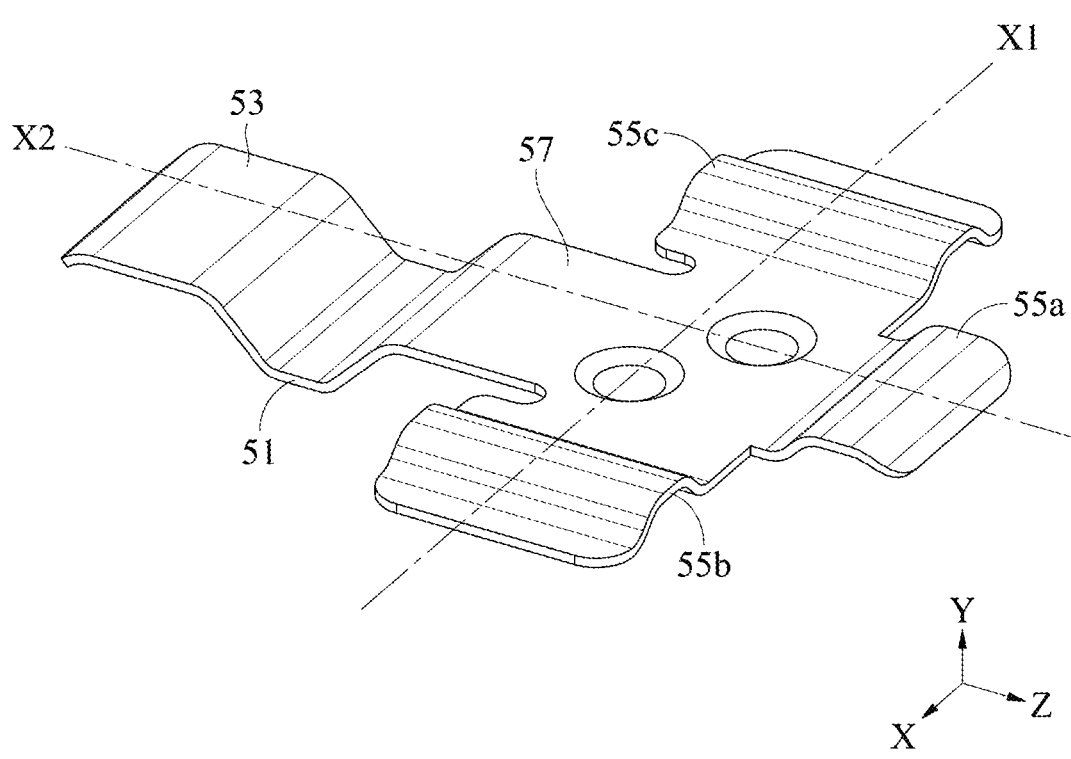
FIG. 13A illustrates a perspective view of an appearance of an elastic component according to some embodiments.
Figure 13B:
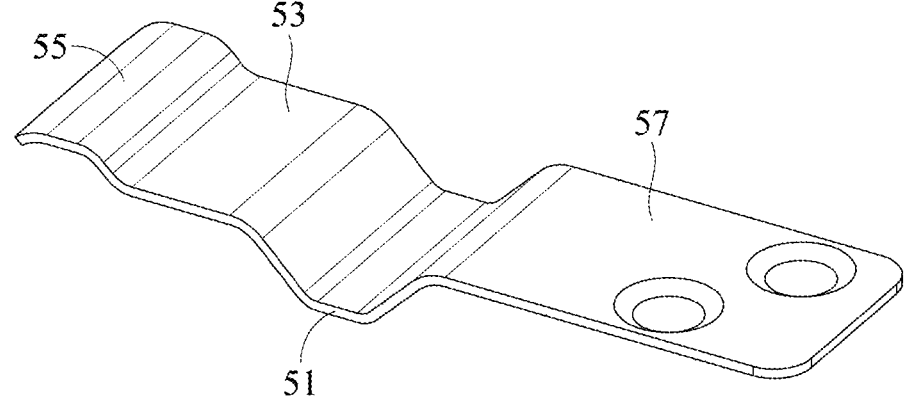
FIG. 13B illustrates a perspective view of an appearance of an elastic component according to some other embodiments.
Figure 13B:
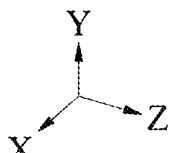

Please refer to FIG. 4, FIG. 13A and FIG. 13B. FIG. 13A illustrates a perspective view of an appearance of the elastic component 50 according to some embodiments; and FIG. 13B illustrates a perspective view of an appearance of the elastic component 50 according to some other embodiments. In some embodiments, the elastic component 50 further includes a body portion 57 and a second protrusion portion 55. The first protrusion portion 51 and the second protrusion portion 55 are connected to the body portion 57. Please refer to FIG. 4 and FIG. 13A. In some embodiments, the first protrusion portion 51 and the second protrusion portion 55 both extend from the body portion 57 in the direction away from the body portion 57. In some embodiments, the second protrusion portion 55 extends from the body portion 57 in the direction away from the body portion 57, and the extension direction of the second protrusion portion 55 is any direction outward from the body of the first protrusion portion 51. In some embodiments, an angular relation is between the first protrusion portion 51 and the second protrusion portion 55. Please refer to FIG. 13A. In some embodiments, the first protrusion portion 51 extends from the body portion 57 in an extension direction along the –Z axis; the second protrusion portion 55a extends from the body portion 57 in an extension direction along the +Z axis; the second protrusion portion 55b extends from the body portion 57 in an extension direction along the +X axis; the second protrusion portion 55c extends from the body portion 57 in an extension direction along the –X axis. An angular relation of 180 degrees is between the extension direction of the first protrusion portion 51 and the extension direction of the second protrusion portion 55a, and an angular relation of 90 degrees is between the extension direction of the first protrusion portion 51 and the extension direction of the second protrusion portion 55b (or the second protrusion portion 55c). Please refer to FIG. 13B. In some embodiments, the second protrusion portion 55 extends from the first protrusion portion 51 in the direction away from the body portion 57; the second protrusion portion 55 is disposed in the –Z axis direction of the first protrusion portion 51. The elastic component 50 may include one or more second protrusion portions 55, and for example, a plurality of second protrusion portions 55 may be disposed along the Z axis to form a wave form. Alternatively, in some embodiments, three second protrusion portions 55 all are disposed in the –Z axis direction of the first protrusion portion 51, where the arrangement of the second protrusion portions 55a, 55b, and 55c are in a cross shape as shown in FIG. 13A. In this embodiment, the appearance of the elastic component 50 is not limited to the aforesaid shapes.

Figure 5:
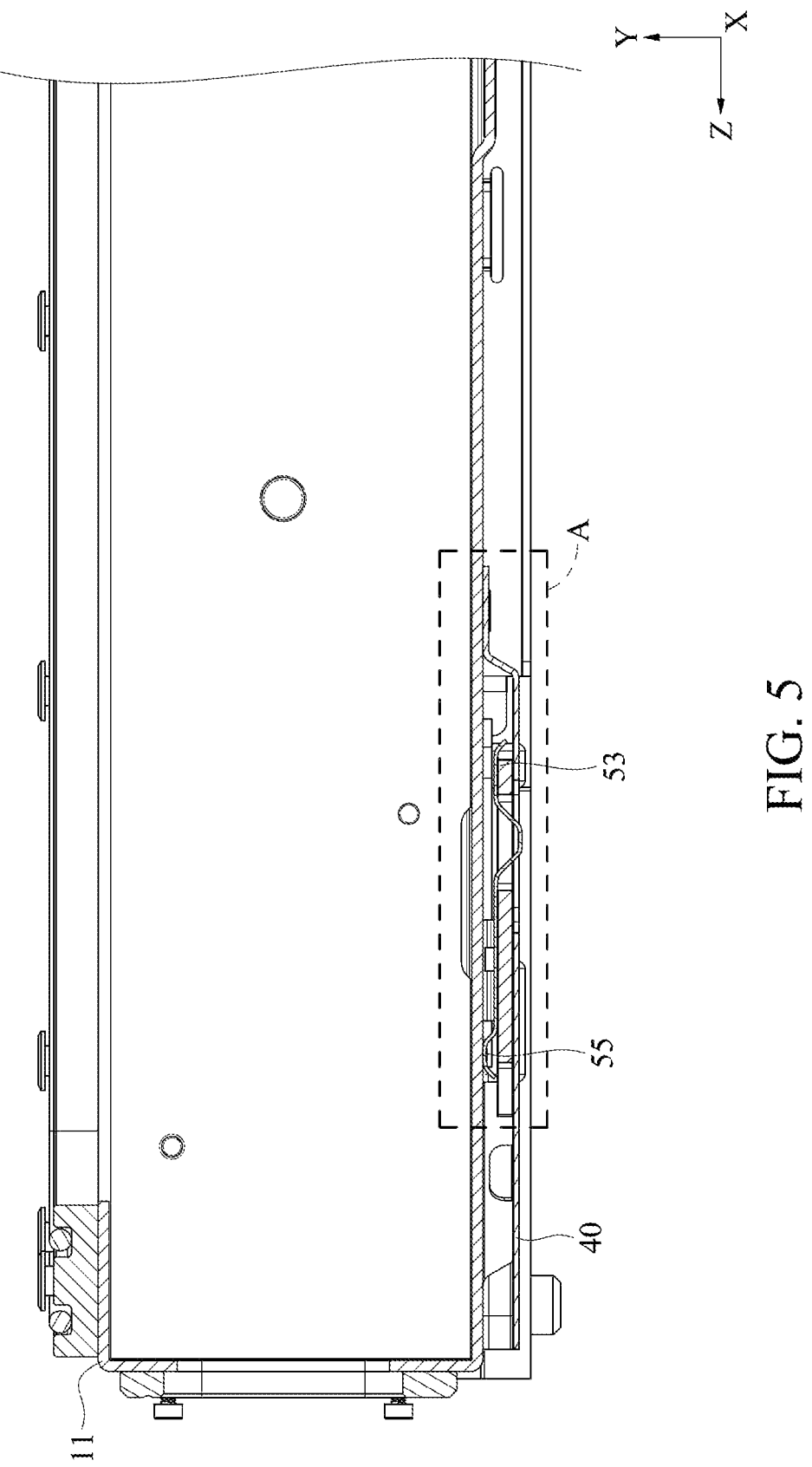
FIG. 5 illustrates a partial cross-sectional view along the line 5-5 shown in FIG. 3.
Figure 6:
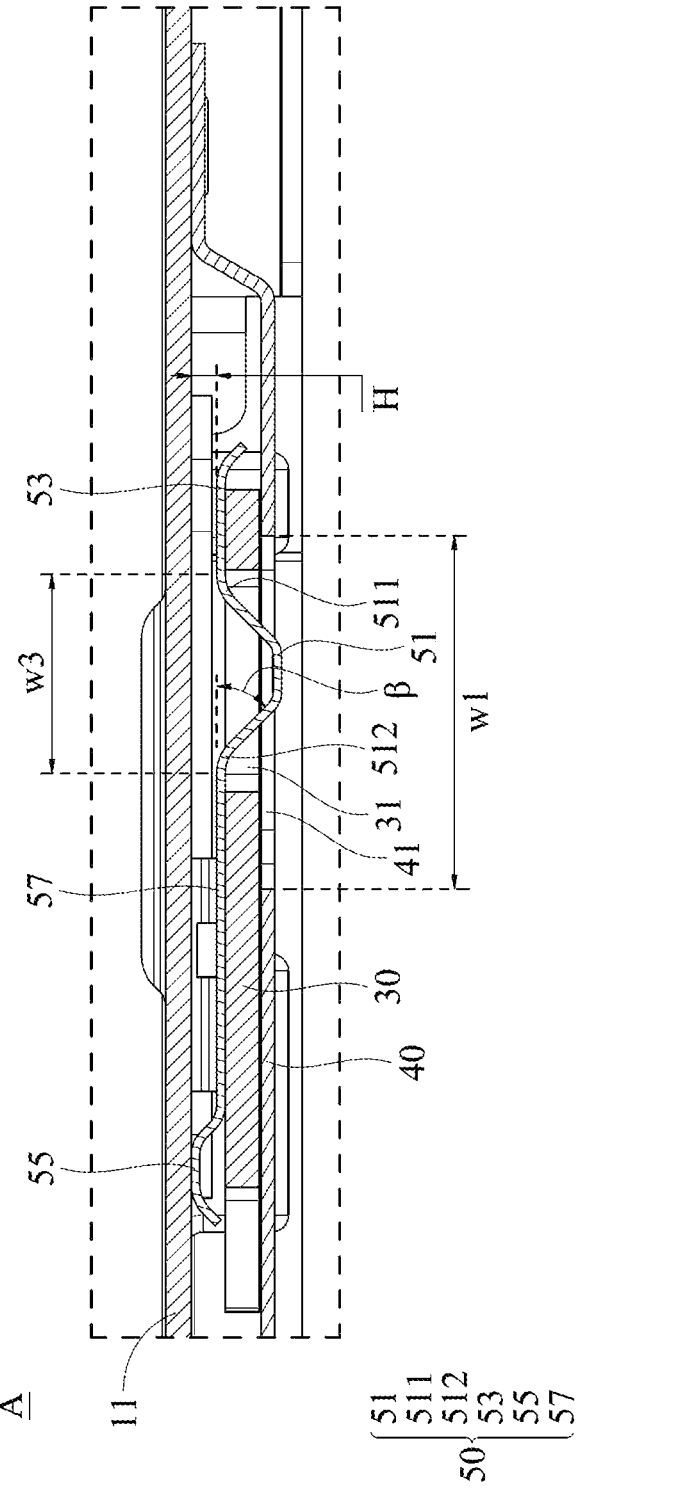
FIG. 6 illustrates an enlarged view of the region A shown in FIG. 5, showing that a first protrusion portion is disposed in a first locking hole.

In addition, please refer to FIG. 5 and FIG. 6. FIG. 5 illustrates a partial cross-sectional view along the line 5-5 shown in FIG. 3; and FIG. 6 illustrates an enlarged view of the region A shown in FIG. 5, showing that a first protrusion portion 51 is disposed in a first locking hole 41. In some embodiments, the protruding direction of the second protrusion portion 55 is different from the protruding direction of the first protrusion portion 51. The second protrusion portion 55 protrudes toward the bottom plate 11 and is used to contact the bottom plate 11 (as shown in FIG. 6). In some embodiments, the protruding shapes of the first protrusion portion 51 and the second protrusion portion 55 are not limited, which may be trapezoids (as shown in FIG. 6) or hemispheres. Please refer to FIG. 6. In some embodiments, the protruding height of the second protrusion portion 55 is substantially equal to a gap between the handle 30 and the bottom plate 11 (or a spacing distance H between the bottom plate 11 and the handle 30). As the elastic component 50 has resilience, the second protrusion portion 55 may be compressed to directly contact the bottom plate 11. Thus, the second protrusion portion 55 may fill the gap between the handle 30 and the bottom plate 11, and the handle 30 is fixed in a certain position of the Y axis in FIG. 6. The elastic component 50 with an effect of position limiting can be provided.

Please refer to FIG. 13A. In some embodiments, the elastic component 50 may include one or more second protrusion portions 55, and the second protrusion portions 55 and the first protrusion portions 51 may extend respectively from one of two ends of the body portion 57 in the direction away from the body portion 57. In some embodiments, one first protrusion portion 51 and one second protrusion portion 55 both extend outwardly from the periphery of the body portion 57 in the direction away from the body portion 57. The extension direction of the second protrusion portion 55 is any direction outward from the body of the first protrusion portion 51, for example, any one of the extension directions of the second protrusion portions 55a, 55b, and 55c shown in FIG. 13A. In some embodiments, by taking the embodiment shown in FIG. 13A as an example, the elastic component 50 may include three second protrusion portions 55. The second protrusion portions 55a, 55b, and 55c and the first protrusion portion 51 all extend outwardly from the periphery of the body portion 57 in the directions away from the body portion 57. The second protrusion portions 55b and 55c are oppositely disposed along a first axis X1 of the elastic component 50. The second protrusion portion 55a and the first protrusion portion 51 are oppositely disposed along a second axis X2 of the elastic component 50. The first axis X1 is different from the second axis X2. In some embodiments, the first axis X1 is the X axis of a three-dimensional coordinate system in FIG. 13A. The second axis X2 is the Z axis of the three-dimensional coordinate system in FIG. 13A. The first axis X1 and the second axis X2 intersect with an angle, indicating that an angular relation is between the first protrusion portion 51 and the second protrusion portion 55. In some embodiments, the angle between the first axis X1 and the second axis X2 may be any angle in a range between 25 degrees and 90 degrees.

Figure 12:
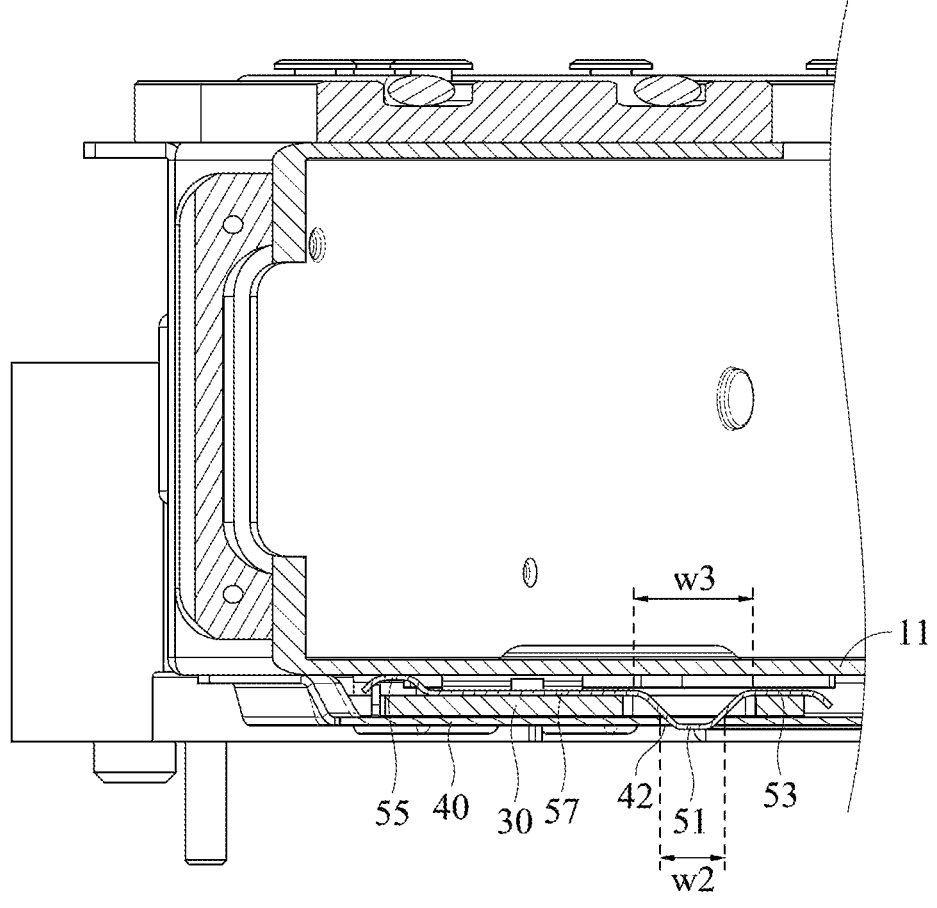
FIG. 12 illustrates a partial cross-sectional view along the line 12-12 shown in FIG. 11, showing that the first protrusion portions is disposed in the second locking hole.
Figure 12:
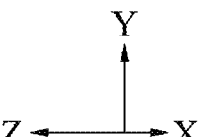

Specifically, please refer to FIG. 3, FIG. 6 and FIG. 12. FIG. 12 illustrates a partial cross-sectional view along the line 12-12 shown in FIG. 11, showing that the first protrusion portion 51 is disposed in the second locking hole 42. Please refer to FIG. 6. In some embodiments, the elastic component 50 includes an extension portion 53. A connection portion between the first protrusion portion 51 and the extension portion 53 is a first turning portion 511. A connection portion between the first protrusion portion 51 and the body portion 57 is a second turning portion 512. The distance between the first turning portion 511 and the second turning portion 512 is the width w3 of the first protrusion portion 51. Please refer to FIG. 3. In some embodiments, the width w1 of the first locking hole 41 is substantially greater than the width w3 of the first protrusion portion 51, and the width w1 of the first locking hole 41 is substantially greater than the width w2 of the second locking hole 42. In some embodiments, the width w2 of the second locking hole 42 is substantially less than or equal to the width w3 of the first protrusion portion 51. Specifically, please refer to FIG. 6 and FIG. 12. In some embodiments, the first protrusion portion 51 has a displacement margin (as shown in FIG. 6) in the first locking hole 41, and the first protrusion portion 51 is limited, without a displacement margin, in the second locking hole 42 (as shown in FIG. 12). Please refer to FIG. 12. In some embodiments, the width w2 of the second locking hole 42 is substantially less than the width w3 of the first protrusion portion 51. In some embodiments, when the first protrusion portion 51 is disposed in the second locking hole 42, the first protrusion portion 51 substantially contacts the mounting plate 40 (or substantially contacts the long edges 421 and 423 in FIG. 3).

On the other hand, please refer to FIG. 4, FIG. 6 and FIG. 10. In some embodiments, the extension portion 53 extends from one end of the first protrusion portion 51 in an outward direction, where the outward direction is any direction away from the body of the first protrusion portion 51. Please refer to FIG. 13A. In some embodiments, the first protrusion portion 51 is disposed between the extension portion 53 and the second protrusion portion 55. Please refer to FIG. 13B. In some embodiments, the extension portion 53 is disposed between the first protrusion portion 51 and the second protrusion portion 55. Please refer to FIG. 6. In some embodiments, an included angle β is between the first protrusion portion 51 and the body portion 57. When the first protrusion portion 51 is disposed in the first locking hole 41 or the second locking hole 42, the angle of the included angle β is about 45 degrees. When the first protrusion portion 51 is abutted against the surface 43 of the mounting plate 40, the angle of the included angle β decreases due to the deformation. Please refer to FIG. 6. In some embodiments, the protruding height of the first protrusion portion 51 is substantially greater than or equal to the spacing distance H between the bottom plate 11 and the handle 30. In some embodiments, the height difference of the protruding height of the first protrusion portion 51 generated by the deformation is substantially less than or equal to the spacing distance H. Please refer to FIG. 10. In some embodiments, when the first protrusion portion 51 is abutted against the surface 43 of the mounting plate 40 to generate the deformation, the extension portion 53 will be correspondingly pushed toward the bottom plate 11 and will contact the bottom plate 11. In some embodiments, the angle of the included angle β' shown in FIG. 10 is less than 45 degrees, and the protruding height of the first protrusion portion 51 is substantially equal to the thickness of the handle 30 (or the depth of the through groove 31). In some embodiments, the first protrusion portion 51 is disposed in a space S between the surface 43 of the mounting plate 40 and the bottom plate 11, and the first protrusion portion 51 contacts the surface 43 of the mounting plate 40. Thus, when the handle 30 is rotated in the direction toward the exterior of the cabinet 70, the extension portion 53 and the bottom plate 11 generate a frictional force to decelerate the ejection speed of the handle 30.

Please refer to FIG. 4. In some embodiments, the second protrusion portion 55 and the extension portion 53 are respectively at one of two ends of the first protrusion portion 51; in other words, in some embodiments, along the Z axis in FIG. 4, the extension portion 53 is disposed at one end of the first protrusion portion 51 toward the −Z axis, and the second protrusion portion 55 is disposed at the other end of the first protrusion portion 51 toward the +Z axis.

Figure 7:
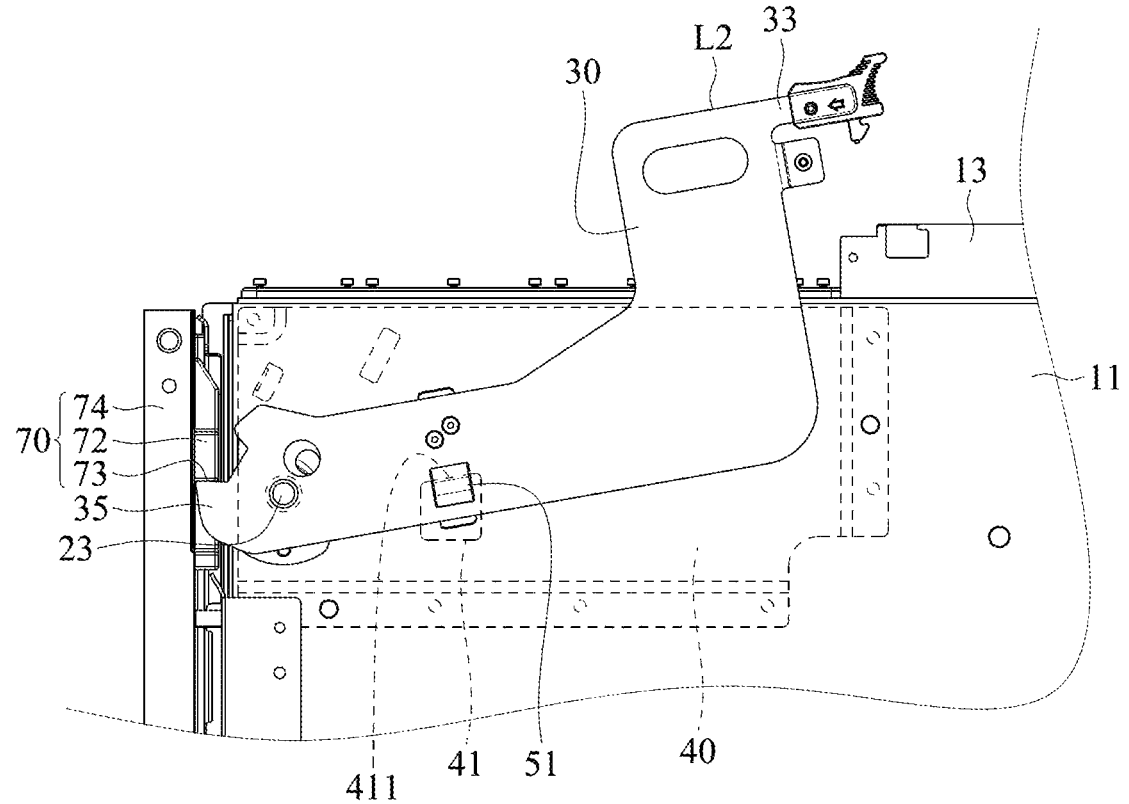
FIG. 7 illustrates a partial perspective view of a frame according to some embodiments, showing that a handle is disposed at a retained position, and a mounting plate is denoted by dotted lines.
Figure 8:
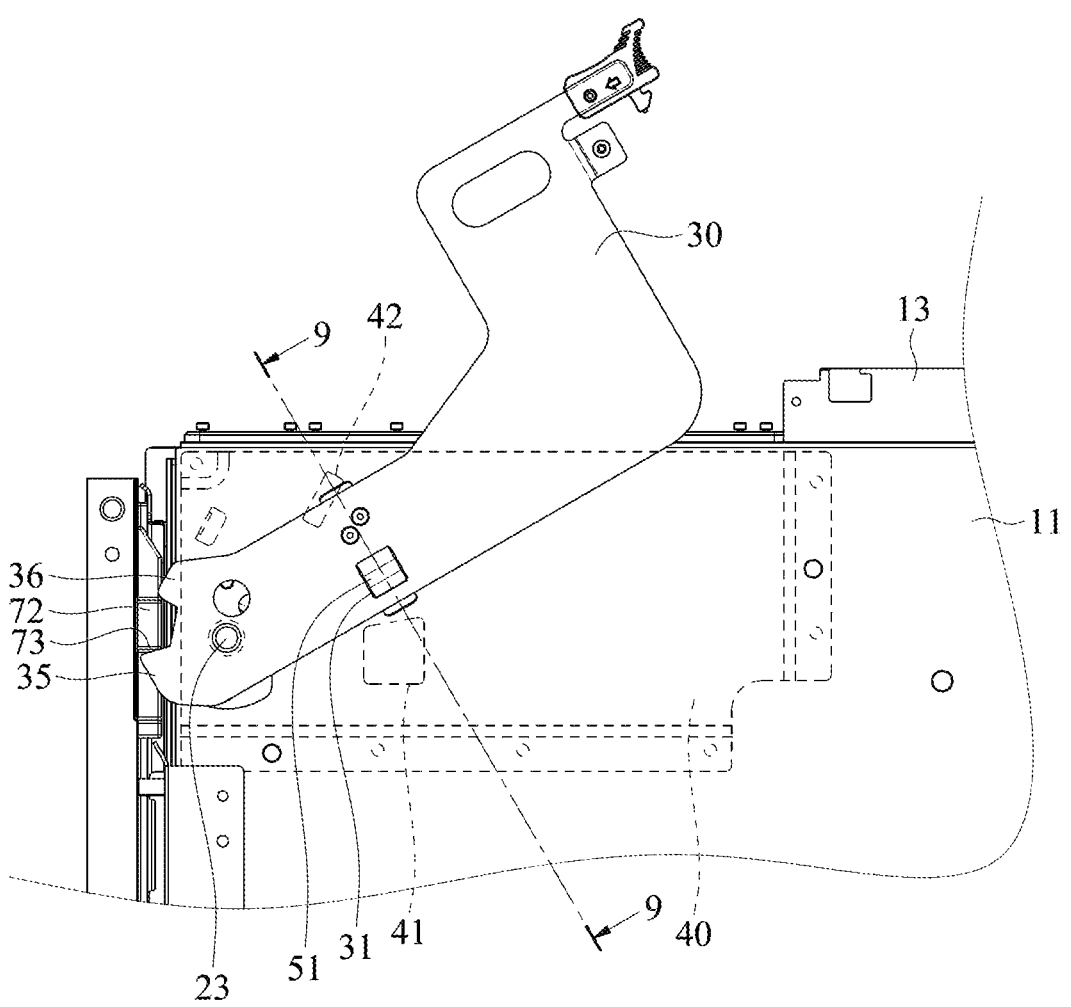
FIG. 8 illustrates a partial perspective view of a frame according to some embodiments, showing that the elastic component is abutted against a surface of a mounting plate denoted by dotted lines.
Figure 9:
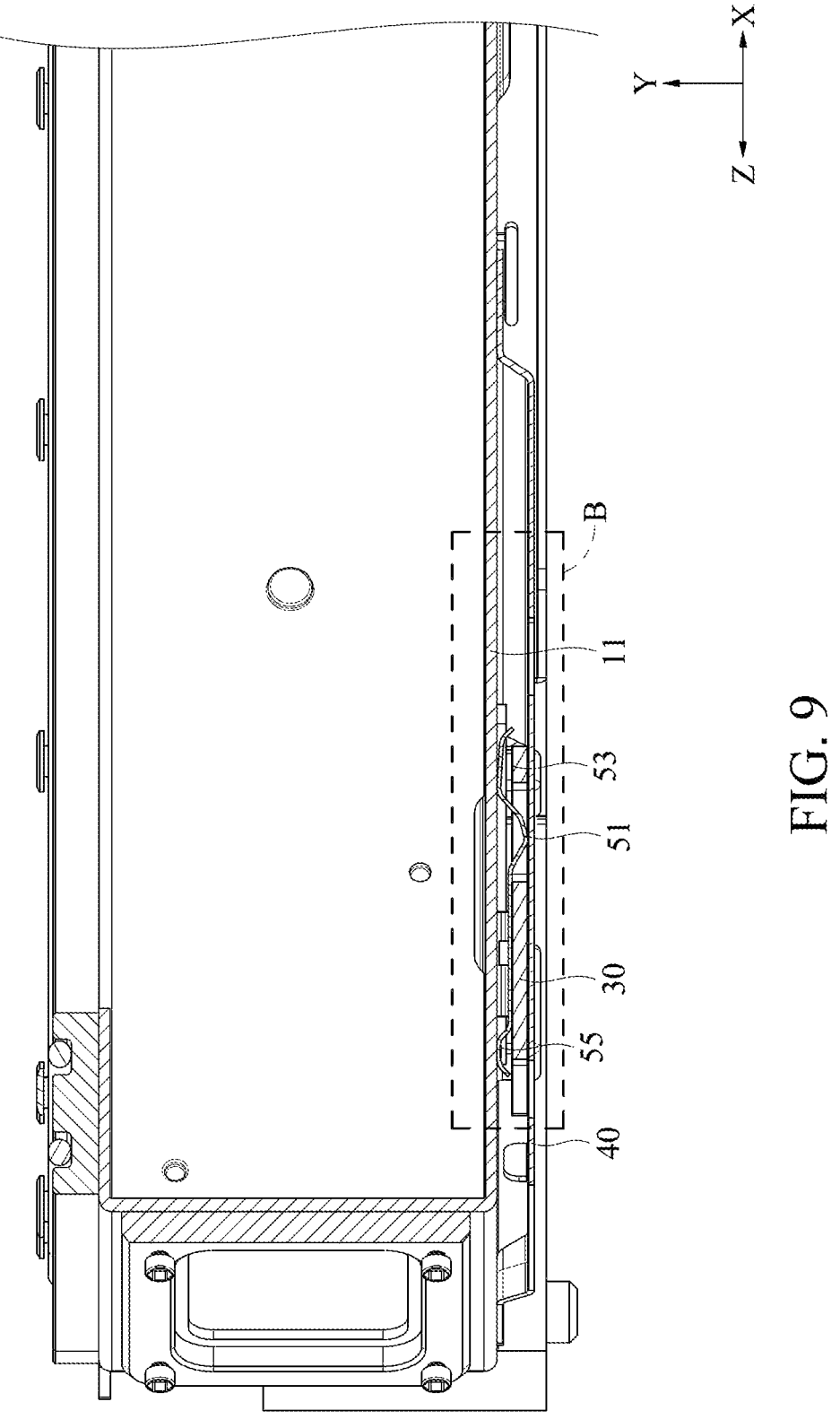
FIG. 9 illustrates a partial cross-sectional view along the line 9-9 shown in FIG. 8, showing that the first protrusion portion is abutted against the surface of the mounting plate, and an extension portion is abutted against the bottom plate.
Figure 10:
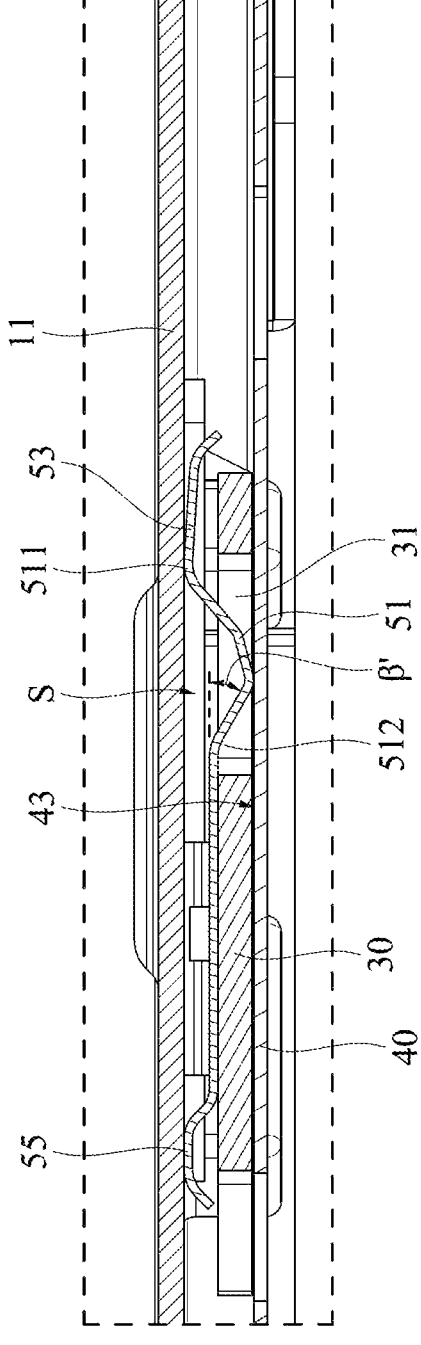
FIG. 10 illustrates an enlarged view of the region B shown in FIG. 9.

Please refer to FIG. 7, FIG. 8, FIG. 9 and FIG. 10. FIG. 7 illustrates a partial perspective view of a frame 71 according to some embodiments, showing that a handle 30 is disposed at a retained position L2, and a mounting plate 40 is denoted by dotted lines; FIG. 8 illustrates a partial perspective view of a frame 71 according to some embodiments, showing that the elastic component 50 is abutted against the surface 43 of a mounting plate 40 denoted by dotted lines; FIG. 9 illustrates a partial cross-sectional view along the line 9-9 shown in FIG. 8, showing that the first protrusion portion 51 is abutted against the surface 43 of the mounting plate 40, and an extension portion 53 is abutted against the bottom plate 11.

Please refer to FIG. 3 and FIG. 11. In some embodiments, in FIG. 3, when the handle 30 is disposed at the locking position L1, the first protrusion portion 51 is disposed in the first locking hole 41, and the holding portion 33 is engaged with the engaging portion 13. In FIG. 11, when the handle 30 is disposed at the unlocked position L3, the first protrusion portion 51 is locked in the second locking hole 42, the holding portion 33 is detached from the engaging portion 13, and the second hook portion 36 contacts the positioning portion 72. Please refer to FIG. 3. In some embodiments, when the bottom plate 11 is slid along the withdrawn direction D1 and toward the exterior of the cabinet 70, each of the two handles 30 is rotated by taking the corresponding one of shafts 23 as the rotational axis and in a direction away from the engaging portion 13. Each of the handles 30 is rotated from the locked position L1 to the unlocked position L3 shown in FIG. 11. Please refer to FIG. 11. In some embodiments, when the bottom plate 11 is slid along the insertion direction D2 and toward the interior of the cabinet 70, each of the handles 30 is rotated by taking the corresponding one of the shafts 23 as the rotational axis and in a direction toward the engaging portion 13 (namely the direction is the clockwise direction in FIG. 11). The handle 30 is rotated from the unlocked position L3 to the locked position L1 shown in FIG. 3. Thus, during the assembling process, the positioning portion 72 may prevent the operator from applying a force excessively to push the tray 10 toward the interior of the cabinet 70 (the insertion direction D2 in FIG. 11), so that the wear of the component is reduced. In addition, the locking portion 34 and the positioning portion 72 may limit the rotation range of the handle 30 on a plane X-Z, and a stable point of force application can be provided to the operator by virtue of the structure configurations of the locking position L1 and the unlocked position L3.

Please refer to FIG. 7. In some embodiments, when the handle 30 is rotated between the locking position L1 and the unlocked position L3, the first protrusion portion 51 is used to continuously contact the mounting plate 40. Specifically, in some embodiments, when the handle 30 is rotated by taking the shaft 23 as the rotational axis and in the direction toward the unlocked position L3 in FIG. 11 from the locked position L1 in FIG. 3, the first protrusion portion 51 contacts the leaned wall 411 of the first locking hole 41, and the handle 30 is disposed at the retained position L2. In some embodiments, when the handle 30 is disposed at the retained position L2, the first hook portion 35 substantially contacts the positioning portion 72. That is, in some embodiments, during the disassembling process, the recess portion 37 is pushed toward the positioning portion 72 by virtue of the rebound force provided by the connector 17 and the docking component 77 in FIG. 2. As the abutted wall 73 of the positioning portion 72 is abutted against the first hook portion 35, the first hook portion 35 interferes with the positioning portion 72. Thus, the handle 30 is rotated by taking the shaft 23 as the rotational axis, resulting in the detachment of the holding portion 33 from the engaging portion 13. In addition, in the embodiments, when the handle 30 is disposed at the retained position L2, the first protrusion portion 51 contacts the leaned wall 411 of the first locking hole 41. Thus, the first locking hole 41 may reduce the rotation speed of the handle 30 toward the unlocked position L3.

As the structure configuration of the handle 30 has the retained position L2, the handle 30 may provide a resistance to reduce the rotation speed of the handle 30 toward the unlocked position L3. Thus, in one or some embodiments, by the succession of two-stage disengaging courses, the handle 30 is rotatable between the locked position L1 and the unlocked position L3, where the rotation of the handle 30 passes through the retained position L2, so that a slower ejection of the handle 30 can be provided and the injury risk of the operator can be reduced.

In addition, please refer to FIG. 8. In some embodiments, when the operator pulls the handle 30 to rotate toward the unlocked position L3, during the rotation process, the first protrusion portion 51 is detached from the first locking hole 41, and the handle 30 is disposed at a position between the locked position L1 in FIG. 3 and the unlocked position L3 in FIG. 11. Please refer to FIG. 10. The first protrusion portion 51 contacts the surface 43 of the mounting plate 40, which indicates that during the rotation process of the handle 30, the through groove 31 may be in the space S between the surface 43 of the mounting plate 40 and the bottom plate 11, that is, in some embodiments, the through groove 31 is neither at a position corresponding to the first locking hole 41 nor the second locking hole 42. The first protrusion portion 51 may be pushed toward the bottom plate 11 and is disposed in the space S, and the first protrusion portion 51 is abutted against the surface 43 of the mounting plate 40 to provide the frictional force for additionally reducing the rotation speed of the handle 30 toward the unlocked position L3. In some embodiments, when the through groove 31 is disposed in the space S, the parts of the first protrusion portion 51 substantially contacts the bottom plate 11 and the mounting plate 40, respectively.

In addition, please refer to FIG. 2. In some embodiments, the guiding stroke for the engagement of the connector 17 and the docking component 77 is about 26 mm. For example, the tray 10 is subjected to the rebound force to be slid toward the released position P2 from the engaged position P1 along the withdrawn direction D1. Please refer to FIG. 7, FIG. 8, FIG. 10, and FIG. 11 in order. During the sliding process, in FIG. 7, the first protrusion portion 51 contacts the leaned wall 411 of the first locking hole 41, and the handle 30 is disposed at the retained position L2, where the sliding distance of the tray 10 is 5 mm. Please refer to FIG. 8 and FIG. 10. As the rotation of the handle 30 continues, the first protrusion portion 51 is pushed into the space S shown in FIG. 10 and contacts the surface 43 of the mounting plate 40, resulting in the configuration of the tray 10 shown in FIG. 8, where the sliding distance is 13 mm. Finally, in FIG. 11, the first protrusion portion 51 is disposed in the second locking hole 42, the handle 30 is disposed at the unlocked position L3, where the sliding distance of the tray 10 is 26 mm. In other words, the distance between the engaged position P1 and the released position P2 of the tray 10 in FIG. 2 is 26 mm.

In addition, please refer to FIG. 2, FIG. 3, FIG. 7, FIG. 8, FIG. 10, and FIG. 11 in order. In FIG. 2, when the components are assembled, the tray 10 is disposed at the engaged position P1, and the handle 30 is disposed at the locked position L1. In FIG. 3, the first protrusion portion 51 is disposed in the first locking hole 41. When the operator is to disassemble the chassis 60 from the cabinet 70, the operator presses the pressing piece 332 first to disengage the pressing piece 332 from the engaging portion 13. Then, the springs inside the connector 17 and the docking component 77 provide the rebound force for pushing the tray 10 slid along the guiding rail portion 74 toward the exterior of the cabinet 70 in the withdrawn direction D1. The recess portion 37 of the handle 30 is pushed toward the positioning portion 72. Thus, the first hook portion 35 is abutted against the positioning portion 72, so to rotate the handle 30 by taking the shaft 23 as the rotational axis and in the direction away from the engaging portion 13, and the first hook portion 35 interferes with the positioning portion 72. Then, please refer to FIG. 7. As the elastic component 50 is fixed on the handle 30, when the handle 30 is rotated, the first protrusion portion 51 of the elastic component 50 is rotated synchronously toward the leaned wall 411 of the first locking hole 41. The handle 30 is disposed at the retained position L2, and the first protrusion portion 51 contacts the leaned wall 411 of the first locking hole 41 so to provide the handle 30 with resistance to reduce the rotation speed of the handle 30 from the engaging portion 13. Then, please refer to FIG. 8 and FIG. 10. The rotation of the handle 30 continues, and is in the direction away from the retained position L2 in FIG. 7. The through groove 31 is neither at the position corresponding to the first locking hole 41 nor the second locking hole 42. In FIG. 10, at this time, the deformation the elastic component 50 is generated accordingly, which indicates that the included angle β' in FIG. 10 is less than the included angle β in FIG. 6, the first protrusion portion 51 is pushed into the space S and is abutted against the surface 43 of the mounting plate 40, and the extension portion 53 substantially contacts the bottom plate 11. Thus, the first protrusion portion 51 and the extension portion 53 may additionally provide the frictional force to decelerate the ejection speed of the handle 30. Finally, please refer to FIG. 11. The handle 30 is rotated at the unlocked position L3, the first protrusion portion 51 is disposed in the second locking hole 42, the second hook portion 36 is abutted against the positioning portion 72, and the first hook portion 35 is detached from the positioning portion 72. Thus, no interference is between the first hook portion 35 and the positioning portion 72. The operator may pull the handle 30 and drive the chassis 60 to be detached from the cabinet 70. The tray 10 hereof is disposed at the released position P2 shown in FIG. 2.

On the other hand, please refer to FIG. 2. when the operator is to assemble the chassis 60 in the cabinet 70, first, the operator inserts the chassis 60 into the frame 71 first to push the tray 10 toward the interior of the frame 71 along the guiding rail portion 74 (in the insertion direction D2). At this time, the tray 10 is disposed at the released position P2, the connector 17 and the docking component 77 are not connected to each other. The handle 30 is disposed at the unlocked position L3, and the first protrusion portion 51 is disposed in the second locking hole 42 (as shown in FIG. 11). Then, please refer to FIG. 11. The operator holds the handle 30 through the holding hole 330 to push the handle 30 toward the engaging portion 13 (that is, in some embodiments, the handle 30 is rotated in the clockwise direction at the angle of view in FIG. 11), so that the tray 10 is pushed away from the released position P2 in FIG. 2 and is slid toward the interior of the frame 71. Then, please refer to FIG. 7. The rotation of the handle 30 continues, and the second hook portion 35 is abutted against the positioning portion 72, so that the operator may push the tray 10 toward the engaged position P1 shown in FIG. 2 in a labor-saving manner by taking the positioning portion 72 as a supporting point. Please refer to FIG. 3. The first protrusion portion 51 is rotated in the first locking hole 41, the operator makes the holding portion 33 engaged with the engaging portion 13, and the handle 30 is disposed at the locked position L1. In FIG. 2, the connector 17 is connected to the docking component 77, the operator may fasten the holding portion 33 in the engaging portion 13 through a fasten component, and the tray 10 hereof is disposed at the engaged position P1.

In conclusion, according to any one or some embodiments, the elastic component disposed on the handle is selectively locked in the first locking hole or the second locking hole of the mounting plate. The elastic component may decelerate the ejection speed of the handle to prevent occurrence of danger due to a rapid ejection of the handle. In addition, according to one or some embodiments, it is convenient to the operator for using the handle during operation. Accordingly, the electronic device with the convenience of assembling can be provided.

What is claimed is:

1. A tray, comprising:
   a bottom plate;
   a mounting plate disposed on the bottom plate, wherein the mounting plate comprises a first locking hole and a second locking hole;
   a handle disposed pivotally on the bottom plate and disposed between the mounting plate and the bottom plate; and
   an elastic component disposed on the handle, wherein the elastic component comprises a first protrusion portion; and the first protrusion portion protruded toward the mounting plate is selectively disposed in the first locking hole or the second locking hole; and
   the elastic component further comprises an extension portion and a body portion; the first protrusion portion extends from the body portion in a direction away from the body portion; the extension portion extends from the first protrusion portion in a direction away from the body portion; the first protrusion portion contacts a surface of the mounting plate facing the handle; and the extension portion is used to contact the bottom plate.

2. The tray according to claim 1, wherein the handle comprises a through groove; the elastic component is disposed between the handle and the bottom plate; and the first protrusion portion of the elastic component is disposed in the through groove.

3. The tray according to claim 1, wherein the elastic component further comprises a second protrusion portion and a body portion; the first protrusion portion extends from the body portion in a direction away from the body portion; the second protrusion portion extends from the first protrusion portion in a direction away from the body portion; the second protrusion portion protrudes toward the bottom plate; and the second protrusion portion is used to contact the bottom plate.

4. The tray according to claim 1, wherein the elastic component further comprises at least one second protrusion portion; the at least one second protrusion portion extends from the body portion in a direction away from the body portion; an angular relation is between the first protrusion portion and the at least one second protrusion portion; the at least one second protrusion portion protrudes toward the bottom plate; and the at least one second protrusion portion is used to contact the bottom plate.

5. The tray according to claim 4, wherein the number of the at least one second protrusion portion is three; two of the three second protrusion portions are oppositely disposed along a first axis of the elastic component; and one of the three second protrusion portions and the first protrusion portion are oppositely disposed along a second axis of the elastic component.

6. The tray according to claim 1, wherein a width of the first locking hole is substantially greater than a width of the second locking hole; and the width of the first locking hole is substantially greater than a width of the first protrusion portion.

7. The tray according to claim 1, wherein the first locking hole of the mounting plate comprises a leaned wall and a bottom wall; the leaned wall is opposite to the bottom wall; and an oblique angle is between the leaned wall and the bottom wall.

8. The tray according to claim 1, further comprising a connector; wherein the bottom plate comprises a carrying portion and an engaging portion; and the engaging portion and the connector are respectively disposed at two ends of the carrying portion.

9. The tray according to claim 1, wherein a locking portion is disposed at one end of the handle; the locking portion comprises a first hook portion, a second hook portion, and a recess portion; and two ends of the recess portion are respectively connected to the first hook portion and the second hook portion.

10. The tray according to claim 1, wherein the handle comprises a through groove; the elastic component is disposed between the handle and the bottom plate; and the first protrusion portion of the elastic component is disposed in the through groove;
   the elastic component further comprises at least one second protrusion portion; the at least one second protrusion portion extends from the body portion in a direction away from the body portion; the at least one second protrusion portion protrudes toward the bottom plate; and the at least one second protrusion portion is used to contact the bottom plate;
   an angular relation is between the first protrusion portion and the at least one second protrusion portion;
   the number of the at least one second protrusion portion is three; two of the three second protrusion portions are oppositely disposed along a first axis of the elastic component; and one of the three second protrusion portions and the first protrusion portion is oppositely disposed along a second axis of the elastic component;
   a width of the first locking hole is substantially greater than a width of the second locking hole; and the width of the first locking hole is substantially greater than a width of the first protrusion portion;
   the first locking hole of the mounting plate comprises a leaned wall and a bottom wall; the leaned wall is opposite to the bottom wall; and an oblique angle is between the leaned wall and the bottom wall;
   the tray further comprises a connector; the bottom plate comprises a carrying portion and an engaging portion; and the engaging portion and the connector are respectively disposed at two ends of the carrying portion; and a locking portion is disposed at one end of the handle; the locking portion comprises a first hook portion, a second hook portion, and a recess portion; and two ends of the recess portion are respectively connected to the first hook portion and the second hook portion.

11. An electronic device, comprising:

a cabinet; and a chassis accommodated in the cabinet, wherein the chassis comprises:

a bottom plate;

a mounting plate disposed on the bottom plate, wherein the mounting plate comprises a first locking hole and a second locking hole;

a handle disposed pivotally on the bottom plate and disposed between the mounting plate and the bottom plate; and an elastic component disposed on the handle, wherein the elastic component comprises a first protrusion portion; and the first protrusion portion protruded toward the mounting plate is selectively disposed in the first locking hole or the second locking hole; and the elastic component further comprises an extension portion and a body portion; the first protrusion portion extends from the body portion in a direction away from the body portion; the extension portion extends from the first protrusion portion in a direction away from the body portion; the first protrusion portion contacts a surface of the mounting plate facing the handle; and the extension portion is used to contact the bottom plate.

12. The electronic device according to claim 11, wherein the handle comprises a through groove; the elastic compo-nent is disposed between the handle and the bottom plate; and the first protrusion portion of the elastic component is disposed in the through groove.

13. The electronic device according to claim 11, wherein the elastic component further comprises a second protrusion portion and a body portion; the first protrusion portion extends from the body portion in a direction away from the body portion; the second protrusion portion extends from the first protrusion portion in a direction away from the body portion; the second protrusion portion protrudes toward the bottom plate; and the second protrusion portion is used to contact the bottom plate.

14. The electronic device according to claim 11, wherein the elastic component further comprises a second protrusion portion; the second protrusion portion extends from the body portion in a direction away from the body portion; an angular relation is between the first protrusion portion and the second protrusion portion; the second protrusion portion protrudes toward the bottom plate; and the second protrusion portion is used to contact the bottom plate.

15. The electronic device according to claim 11, wherein the bottom plate further comprises a connector; the cabinet comprises a docking component; and the connector is used to be connected to the docking component to dispose the chassis in the cabinet.

16. The electronic device according to claim 11, wherein the cabinet further comprises a positioning portion; the handle further comprises a locking portion; and the handle is used to fit the positioning portion of the cabinet with the locking portion to position the chassis in the cabinet.

* * * * *